(12) United States Patent
Hwang

(10) Patent No.: US 9,966,117 B2
(45) Date of Patent: May 8, 2018

(54) DOUBLE DATA RATE DECODING DEVICE WITH EDGE-TRIGGERED SHIFTING LATCH STAGES

(71) Applicant: SK hynix Inc., Gyeonggi-do (KR)

(72) Inventor: Won-Seok Hwang, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days. days.

(21) Appl. No.: 15/097,721

(22) Filed: Apr. 13, 2016

(65) Prior Publication Data
US 2017/0133065 A1    May 11, 2017

(30) Foreign Application Priority Data

Nov. 9, 2015 (KR) .......................... 10-2015-0156608

(51) Int. Cl.
| G11C 7/10 | (2006.01) |
|---|---|
| G11C 8/18 | (2006.01) |
| G11C 19/28 | (2006.01) |
| H03K 3/356 | (2006.01) |
| H03K 3/037 | (2006.01) |

(52) U.S. Cl.
CPC ................ *G11C 7/10* (2013.01); *G11C 7/106* (2013.01); *G11C 7/1087* (2013.01); *G11C 8/18* (2013.01); *G11C 19/28* (2013.01); *H03K 3/037* (2013.01); *H03K 3/356026* (2013.01)

(58) Field of Classification Search
None
See application file for complete search history.

(56) References Cited

U.S. PATENT DOCUMENTS

| 4,122,442 A * | 10/1978 | Henry ................... H03M 3/042 341/143 |
|---|---|---|
| 4,728,823 A * | 3/1988 | Kinoshita ........ H03K 3/356165 326/16 |
| 5,815,129 A * | 9/1998 | Jung .................... G09G 3/3677 345/100 |
| 2002/0075222 A1* | 6/2002 | Miyatake ............. G09G 3/3648 345/100 |
| 2003/0076918 A1* | 4/2003 | Azuma .................. G11C 19/00 377/73 |

FOREIGN PATENT DOCUMENTS

| KR | 1020100092542 | 8/2010 |
|---|---|---|
| KR | 1020110033583 | 3/2011 |

* cited by examiner

*Primary Examiner* — J. H. Hur
(74) *Attorney, Agent, or Firm* — IP & T Group LLP

(57) ABSTRACT

Disclosed are a latch circuit receiving a negative output of a next latch stage circuit as a feedback input, a double data rate (DDR) ring counter based on the latch circuit to perform DDR counting of pulse periods and reduce the number of toggles, a hybrid counting device counting lower-bit portion by using the latch-based DDR ring counter and upper-bit portion by using a binary counter, and an analog-to-digital converting device and a CMOS image sensor employing the hybrid counting device. A double data rate ring counter may include a plurality of latches coupled in a form of a ring. The plurality of latches may include positive-edge-triggered latches and negative-edge-triggered latches arranged alternately. A current latch stage receives an output of a preceding latch stage to shift to a next latch stage according to a counter clock, receives an output of the next latch stage to check a data shift to the next latch stage, and falls to a low level if the data shift is checked.

8 Claims, 7 Drawing Sheets

DOUBLE DATA RATE DECODING DEVICE WITH EDGE-TRIGGERED SHIFTING LATCH STAGES

CROSS-REFERENCE TO RELATED APPLICATIONS

The present application claims priority of Korean Patent Application No. 10-2015-0156608, filed on Nov. 9, 2015, which is incorporated herein by reference in its entirety.

BACKGROUND

1. Field

Various embodiments of the present invention relate generally to a decoding device suitable for shifting addresses in a device such as a CMOS image sensor and, more particularly, to a latch circuit and a double data rate decoding device implemented based on the latch circuit.

2. Description of the Related Art

A CMOS image sensor (CIS) captures an image using a property of semiconductor material that it responds to an incident light. The CMOS image sensor may include an array of multiple pixels, each of which may have an image sensing element, such as a photodiode, and a plurality of transistors. The CMOS image sensor may generate an electric image signal corresponding to the incident light.

FIG. 1 is a block diagram of a typical CMOS image sensor 100.

Referring to FIG. 1, the CMOS image sensor 100 may include a pixel array suitable for transforming an incident light energy into an electric energy, a correlated double sampling (CDS)/column decoder 120 suitable for removing a fixed pattern noise and decoding addresses in a column direction, an analog-to-digital converter with a programmable gain amplifier (PGA/ADC) 130 suitable for adjusting an intensity of an analog image signal and converting the analog image signal into a digital image signal, a row decoder 140 suitable for decoding addresses in a row direction, a row driver 150 suitable for driving a row in the pixel array in response to a row address, and a controller 160 suitable for controlling all the circuits above.

The pixel array 110 may include pixel sensors, one of which is shown in FIG. 2. Each pixel in the pixel array 110 may be addressed by the row decoder 140 and the CDS/column decoder 120.

FIG. 2 is a circuit diagram of a unit pixel in a conventional CMOS image sensor.

The unit pixel 200 shown in FIG. 2 may include a photodiode 210 and four transistors, transfer transistor TX, reset transistor RX, drive transistor DX, and select transistor SX. Among the four transistors, the transfer transistor TX may transfer photocharges generated in the photodiode 210 to a floating diffusion node A. The reset transistor RX may discharge the charges stored in the floating diffusion node A to detect a next signal and may read out a reset voltage level. The drive transistor DX may be connected to a source follower suitable for driving a sample-and-hold circuit to interface between a pixel and the PGA/ADC 130 of FIG. 1 for receiving an output signal of the pixel without distorting the signal from the pixel. The select transistor SX may address the pixels so that pixel voltages are read out on row by row basis. The remaining transistor may be a load transistor LD driven by a pixel bias voltage.

The unit pixel 200 shown in FIG. 2 may operate as follows.

First, the reset transistor RX and the transfer transistor TX may be turned on, and then turned off. Subsequently, the select transistor SX may be turned on, and a reset voltage may be read out. Afterwards, a signal may be read out by turning on the transfer transistor TX so that photocharges generated in the photodiode 210 for a certain time may be transferred to the floating diffusion node A. The difference in level between the signal voltage and the reset voltage may be an output signal of a pixel corresponding to the light incident for the certain time.

FIG. 3 shows a circuit diagram of a conventional row decoder 140.

Reset gate signals RSi-RSi+7 transfer gate signals TFi-TFi+7, and select gate signals SLi-SLi+7 for each row may be generated from a combination of a row address signal Ai-Ai+7, a reset signal RX, a transfer signal TX, and a select signal SEL. For example, when signals selecting a row address are inputted, the reset gate signals RSi-RSi+7, the transfer gate signals TFi-TFi+7 and the select gate signals SLi-SLi+7 for the row corresponding to the row address may be generated and outputted by the row decoder.

The described conventional address decoding scheme may select a desired line using an input address, but may be disadvantageous in that the size of the CMOS image sensor needs to be sufficiently large to accommodate the plurality of address lines.

Moreover, there is a need for a latch-based decoding device that operates twice at a single clock cycle to enable double data rate (DDR) operation in order to facilitate an effective channel selection by a single address.

SUMMARY

Various embodiments of the invention are directed to a latch circuit that receives a negative output of a next stage as a feedback input.

Also, various embodiments of the invention are directed to a double data rate (DDR) decoding device implemented on a basis of the latch circuit that operates twice at a single clock cycle to enable the DDR operation.

In accordance with an embodiment of the present invention, a latch circuit may include a feedback input unit suitable for using a shifting clock and an output of a next latch stage as inputs; and a latching unit suitable for holding data according to a state of the shifting clock.

When the output of the next latch stage is changed to a high level, the feedback input unit may receive a negative output of the next latch stage and changes an output of a current latch stage to a low level according to the shifting clock.

A phase of a shifting clock of a preceding latch stage may be arranged to be opposite to the phase of the shifting clock of a current latch stage and the phase of the shifting clock of the current latch stage may be arranged to be opposite to the phase of the shifting clock of the next latch stage.

In accordance with still another embodiment of the present invention, a double data rate decoding device may include a plurality of positive-edge-triggered latches and a plurality of negative-edge-triggered latches disposed alternately, wherein a current latch stage shifts an output of a preceding latch stage to a next latch stage every half a cycle of a shifting clock and operates in double data rate due to an alternate disposition of the plurality of positive-edge-triggered latches and the plurality of negative-edge-triggered latches.

The double data rate decoding device may further include a start latch, wherein the start latch includes a feedback input unit suitable for using the shifting clock and an output of the next latch stage as inputs; and a latching unit suitable for holding data according to a state of the shifting clock.

The double data rate decoding device may further include a plurality of intermediate latches wherein each of the intermediate latches includes an input unit suitable for using the shifting clock and an output of the preceding latch stage as inputs; a feedback input unit suitable for using the shifting clock and an output of the next latch stage as inputs; and a latching unit suitable for holding data according to a state of the shifting clock.

When the output of the next latch stage is changed to a high level, the feedback input unit may receive a negative output of the next latch stage and change an output of the current latch stage to a low level according to the shifting clock.

In accordance with yet another embodiment of the present invention, a double data rate decoding device may include a shifting unit comprising a plurality of positive-edge-triggered latches and a plurality of negative-edge-triggered latches disposed alternately to shift pulse signals every half a cycle of a shifting clock and suitable for operating in double data rate due to an alternate disposition of the plurality of positive-edge-triggered latches and the plurality of negative-edge-triggered latches, and a decoding unit suitable for decoding the pulse signals shifted and outputted by the shifting unit every half the cycle.

The double data rate decoding device may further include a selection unit suitable for selectively outputting a decoded signal from the decoding unit.

The selection unit mar selectively output the decoded signal in a preset interval of a data pulse signal.

The selection unit may include a plurality of AND gates suitable for performing AND operations on the decoded signal from the decoding unit and an output enable signal from an external controller.

The shifting unit may include a first latch having a set input terminal and suitable for receiving the shifting clock from a clock controller through an inverted clock terminal thereof and a negative output of a next latch stage through a second input terminal thereof; an (n−1)-th latch having a reset input terminal and suitable for receiving the shifting clock through a clock terminal or an inverted clock terminal thereof, receiving a positive output of the first latch through a first input terminal thereof, and receiving a negative output of the next latch stage through a second input terminal thereof; and an n-th latch having a reset input terminal and suitable for receiving the shifting clock through an inverted clock terminal thereof, and receiving a positive output of the (n−1)-th latch through a first input terminal thereof.

The shifting unit may further include a start latch, the start latch includes a feedback input unit suitable for using the shifting clock and an output of the next latch stage as inputs; and a latching unit suitable for holding data according to a state of the shifting clock.

The shifting unit may include a plurality of intermediate latches, each of the intermediate latches includes an input unit suitable for using the shifting clock and an output of the preceding latch stage as inputs; a feedback input unit suitable for using the shifting clock and an output of the next latch stage as inputs; and a latching unit suitable for holding data according to a state of the shifting clock.

When the output of the next latch stage is changed to a high level, the feedback input unit may receive a negative output of the next latch stage and change an output of a current latch stage to a low level according to the shifting clock.

The decoding unit may include a plurality of AND gates each suitable for performing an AND operation on positive outputs of two adjacent latches in the shifting unit.

In accordance with yet another embodiment of the present invention, a double data rate decoding device may include a plurality of latch stages arranged in series, wherein each latch stage may shift an output of a preceding latch stage to a next latch stage in response to a shifting clock CLK, wherein the plurality of latch stages comprise a plurality of negative-edge-triggered latches and positive-edge-triggered latches disposed alternately for shifting pulse signals every half a cycle and operate in a double data rate.

The double data rate decoding device further include a decoding unit 430 for decoding and outputting the pulse signals from the shifting unit 420.

The double data rate decoding device further include a selection unit for selectively outputting signal from the decoding unit.

DETAILED DESCRIPTION

Figure 1:
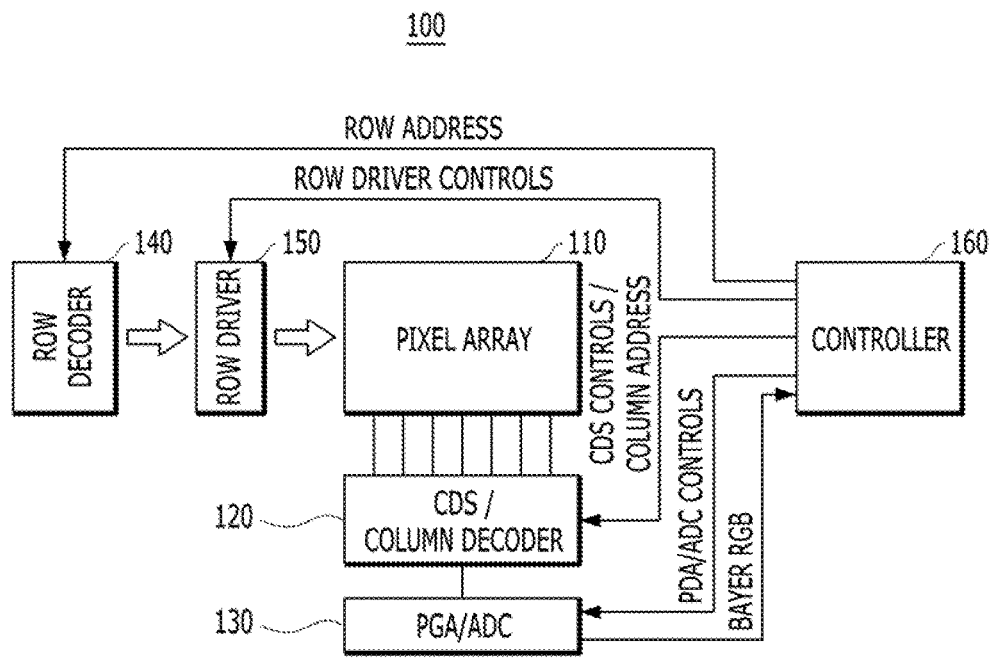
FIG. 1 is a block diagram of a conventional CMOS image sensor.
Figure 2:
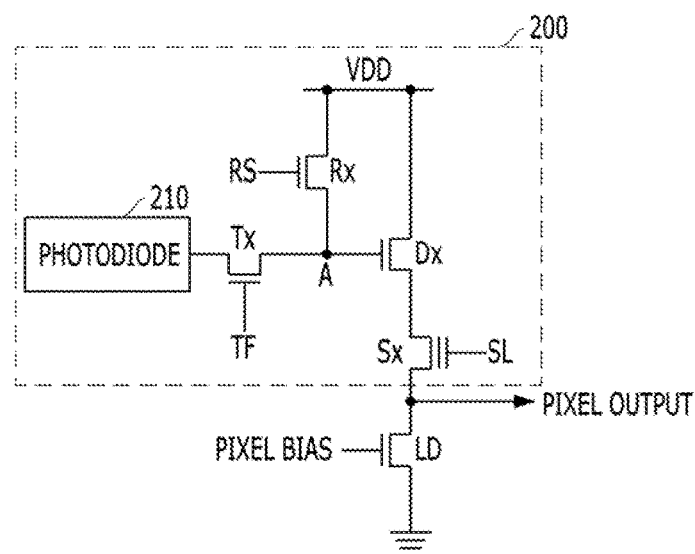
FIG. 2 is a circuit diagram of a conventional unit pixel in a conventional CMOS image sensor.
Figure 3:
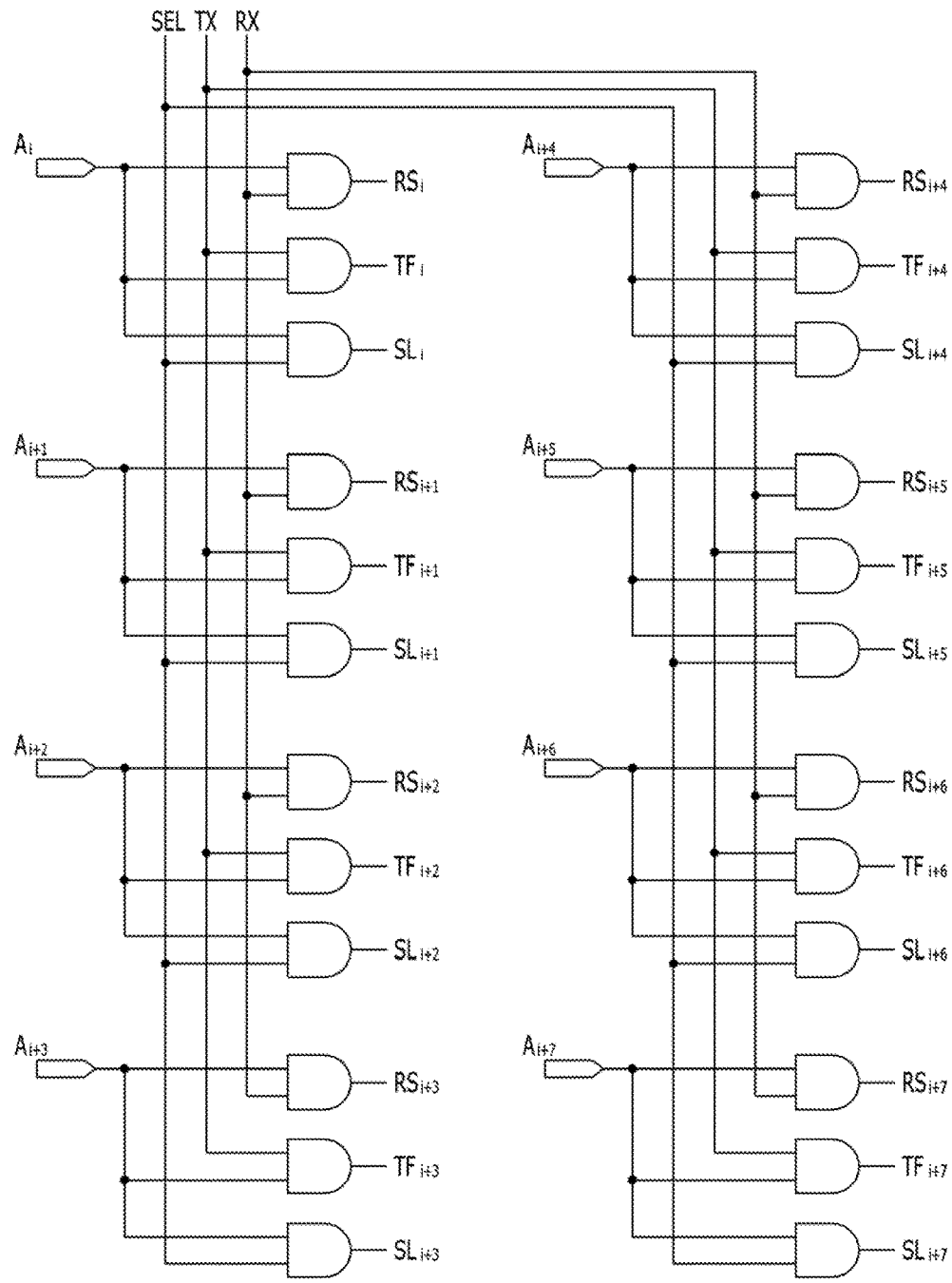
FIG. 3 is a circuit diagram of a conventional row decoder.

Various embodiments of the present invention will be described below in more detail with reference to the accompanying drawings. The present invention may, however, be embodied in different forms and should not be construed as being limited to the embodiments set forth herein. Rather, these embodiments are provided so that this disclosure will be thorough and complete. Throughout the disclosure, like reference numerals refer to like parts throughout the various figures and embodiments of the present invention.

In this disclosure, when one part is referred to as being 'connected' to another part, it should be understood that the former can be 'directly connected' to the latter, or 'electrically connected' to the latter via an intervening part. Furthermore, the terms 'comprises', 'includes' or 'has' and the like when used herein should be understood as being inclusive terms allowing the presence of other elements in addition to the elements expressly stated. Moreover, singular terms may include plural forms unless specifically stated otherwise.

Figure 4:
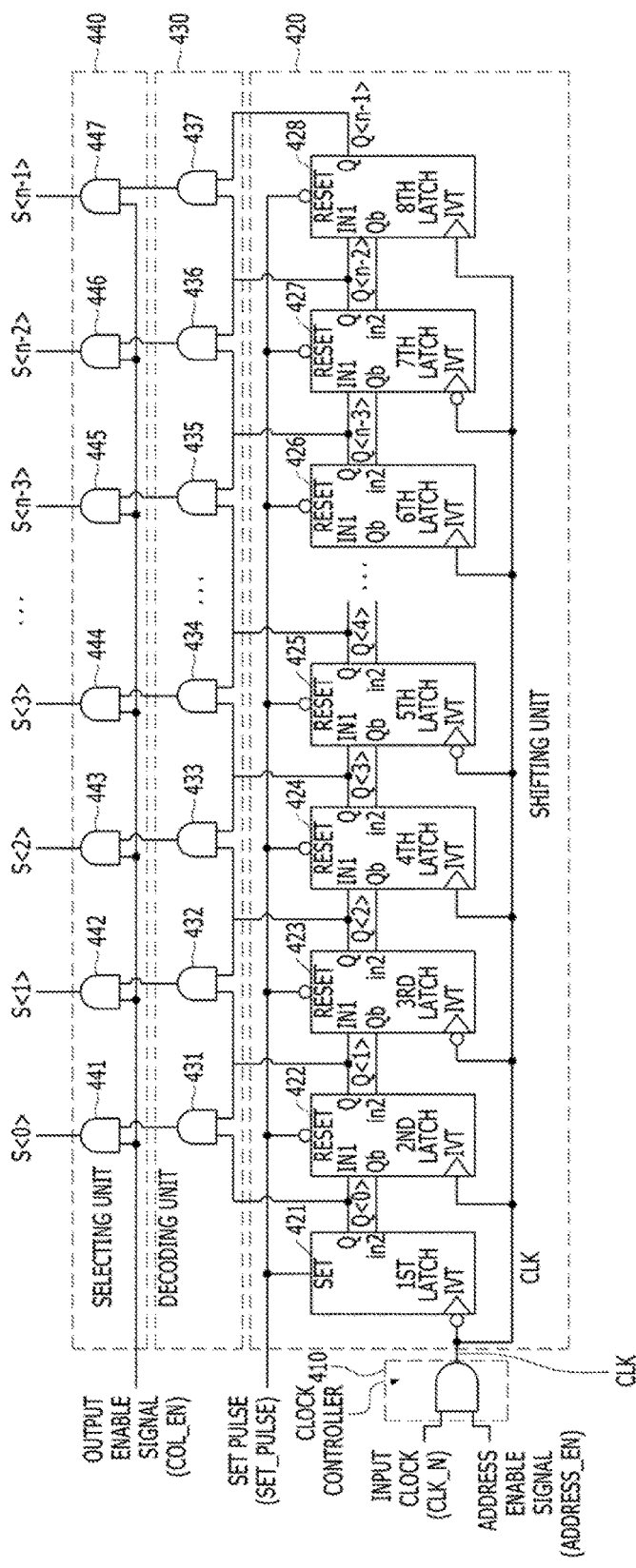
FIG. 4 is a circuit diagram of a double data rate decoding device including a latch in accordance with an embodiment of the present invention.

As shown in FIG. 4, the latch-based DDR decoding device, according to an embodiment of the present invention, may include a plurality of latch stages wherein each latch stage may shift an output of a preceding (immediately before) latch stage to a next (immediately after) latch stage in response to a shifting clock CLK. More particularly, negative-edge-triggered latches 421, 423, 425, and 427 and positive-edge-triggered latches 422, 424, 426, and 428 may be disposed alternately, and the latch-based DDR decoding device may shift signals by one stage every half a cycle. Accordingly, the latch-base DDR decoding device may operate in the double data rate.

The latch-based DDR decoding device may include a shifting unit 420 including the negative-edge-triggered latches 421, 423, 425, and 427 and the positive-edge-triggered latches 422, 424, 426, and 428 disposed alternately for shifting the pulse signals every half a cycle and operate in the double data rate. The latch-based DDR decoding device may also include a decoding unit 430 for decoding and outputting the pulse signals from the shifting unit 420.

Also, the latch-based DDR decoding device may include a selection unit 440 configured to selectively output signals from the decoding unit 430.

The latch-based DDR decoding device may shift a pulse signal according to a shifting clock, for a duration of a certain data pulse, e.g., a duration of an address enable signal. For this operation, a clock controller 410 may receive an address enable signal ADDRESS_EN and an input clock CLK_IN to generate a shifting clock CLK synchronized with the address enable signal and to output the synchronized shifting clock CLK to the shifting unit 420. The clock controller 410 may be implemented by an AND gate for performing an AND operation on the address enable signal ADDRESS_EN and the input clock CLK_IN.

In an embodiment, after all the latches 421-428 are initialized by a set pulse signal SET_PULSE, the pulse signals corresponding to one clock period may be shifted from a first latch stage, i.e., starting latch, to a next latch stage, e.g., a second latch, according to the shifting clock CLK. Here the pulse signals may be overlapped between the stages by a phase of half a clock and shifted in the double data rate due to the alternate disposition between the negative-edge-triggered latches 421, 423, 425, and 427 and the positive-edge-triggered latches 422, 424, 426, and 428.

The decoding unit 430 may include a plurality of AND gates 431-437, each of which is configured to perform an AND operation on positive output signals of two adjacent latches.

The selection unit 440, may be an optional component. The selection unit 440 may selectively output decoded signals from the decoding unit 430 only for a preset data pulse duration, for example, when an output enable signal COL_EN having a certain pulse width may be activated. The selection unit 440 may include a plurality of AND gates 441-447, each of which performs an AND operation on each of the decoded signals from the decoding unit 430 and the output enable signal COL_EN provided by an external controller, for example, a timing generator not illustrated in the drawing, wherein the output enable signal COL_EN may have a pulse width of a desired output duration. For example, an address decoder in some applications may be used in a state that some portions in leftmost, rightmost, top or bottom position may be deactivated. In such applications the selection unit 440 may perform AND operations on signals received from the decoding unit 430 and the output enable signal COL_EN to truncate some of the leftmost or rightmost addresses and adjust a horizontal data size.

In more detail with reference to FIG. 4, the shifting unit 420 may include a first latch to n-th latches 421-428 connected in series. The first latch 421 may be a negative-edge-triggered latch including a set terminal SET, an inverted clock terminal IVT for receiving the shifting clock CLK from the clock controller 410, and a second input terminal IN2 for receiving a negative output signal Qb from the second latch 422. The second latch 422 may be a positive-edge-triggered latch including a reset terminal RESET, a clock terminal for receiving the shifting clock CLK, a first input terminal IN1 for receiving a positive output signal Q<0> from the first latch 421, and a second input terminal IN2 for receiving a negative output signal Qb from the third latch 423. The third latch 423 may be a negative-edge-triggered latch including a reset terminal RESET, an inverted clock terminal IVT for receiving the shifting clock CLK, a first input terminal IN1 for receiving a positive output signal Q<1> from the second latch 422, and a second input terminal IN2 for receiving a negative output signal Qb from the fourth latch 424. The fourth latch 424 may be a positive-edge-triggered latch including a reset terminal RESET, a clock terminal for receiving the shifting clock CLK, a first input terminal IN1 for receiving a positive output signal Q<2> from the third latch 423, and a second input terminal IN2 for receiving a negative output signal Qb from the fifth latch 425. The fifth latch 425 may be a negative-edge-triggered latch including a reset, terminal RESET, an inverted clock terminal for receiving the shifting clock CLK, a first input terminal IN1 for receiving a positive output signal Q<3> from the fourth latch 424, and a second input terminal IN2 for receiving a negative output signal Qb from a next latch stage. An (n−2)-th latch 426 may be a positive-edge-triggered latch including, a receiving clock terminal for receiving the shifting clock CLK, a first input terminal IN1 for receiving a positive output signal from a preceding latch stage, and a second input terminal IN2 for receiving a negative output signal Qb from an (n−1)-th latch 427. The (n−1)-th latch 427 may be a negative-edge-triggered latch including a reset terminal RESET, an inverted clock terminal for receiving the shifting clock CLK, a first input terminal IN1 for receiving a positive output signal Q<n−3> from the (n−2)-th latch 426 and a second input terminal IN2 for receiving a negative output signal Qb from an n-th latch. An n-th latch 428 may be a positive-edge-triggered latch including a reset terminal RESET, a clock terminal for receiving the shifting clock CLK and a first input terminal IN1 for receiving a positive output signal from the (n−1)-th latch.

The number of stages in the shifting unit 420 may be adjusted depending on the number of bits of a digital signal indicating a shifting result. For example, the number of stages in the shifting unit 420 may be changeable depending on the number of bits of the digital signals Q<0> to Q<n−1>.

As described above, the shifting unit 420 may include the negative-edge-triggered latches 421, 423, 425, and 427 and the positive-edge-triggered latches 422, 424, 426, and 428 disposed alternately to implement the double data rate operation based on latch circuits. The first latch 421 as a starting latch may be a set-type latch having the set terminal SET. The other latches, i.e. the second to eighth latches 422-428, may be reset-type latches having the reset terminals RESET. Although it is shown in FIG. 4 that the first latch 421 may receive the set pulse signal SET_PULSE from an external controller, e.g. the timing generator, and the second to n-th latches 422-428 may receive the set pulse signal SET_PULSE through respective inverting input terminals, the second to n-th latches 422-428 may receive alternatively a separate reset pulse signal from the external controller instead of the set pulse signal to be inverted.

During an initialization or initial timing procedure, the first latch 421 may be set to a high level and the remaining second to n-th latches 422-428 may be set to low levels. Afterwards, if the shifting clock CLK which is synchronized with the address enable signal ADDRESS_EN is inputted from the clock controller 410 the pulse signal corresponding to one clock period may be shifted from the current latch stage to the next latch stage. The shifted pulse signals may overlap between the stages by a phase of half a clock due to the alternate disposition between the negative-edge-triggered latches 421, 423, 425, and 427 and the positive-edge-triggered latches 422, 424, 426, and 428.

Meanwhile, the decoding unit 430 may include a first to (n−1)-th AND gates 431-437. The first AND gate 431 may perform an AND operation on positive output signals of the first and the second latches 421 and 422. The second AND gate 432 may perform an AND operation on positive output signals of the second and the third latches 422 and 423. The third AND gate 433 may perform an AND operation on positive output signals of the third and the fourth latches 423 and 424. The fourth AND gate 434 may perform an AND operation on positive output signals of the fourth and the fifth latches 424 and 425. The (n−3)-th AND gate 435 may perform an AND operation on positive output signals of the (n−3)-th latch (not illustrated) and the (n−2)-th latches 426. The (n−2)-th AND gate 436 may perform an AND operation on positive output signals of the (n−2)-th and the (n−1)-th latches 426 and 427. The (n−1)-th AND gate 437 may perform an AND operation on, positive output signals of the (n−1)-th and the n-th latches 427 and 428.

The selection unit 440 may include AND gates 441-447. The AND gate 441 may perform an AND operation on a decoded signal from the AND gate 431 and the output enable signal COL_EN from the external controller. The AND gate 442 may perform an AND operation on a decoded signal from the AND gate 432 and the output enable signal COL_EN. The AND gate 443 may perform an AND operation on a decoded signal from the AND gate 433 and the output enable signal. The AND gate 444 may perform an AND operation on a decoded signal from the AND gate 434 and the output enable signal COL_EN. The AND gate 445 may perform an AND operation on a decoded signal from the AND gate 435 and the output enable signal COL_EN. The AND gate 446 may perform an AND operation on a decoded signal from the AND gate 436 and the output enable signal COL_EN. The AND gate 447 may perform an AND operation on a decoded signal from the AND gate 437 and the output enable signal COL_EN.

As discussed above, in the latch-based address decoding device according to an embodiment of the present invention, address lines may be eliminated from the latch circuits to minimize a size of the address decoding device. Also, the embodiment implements a double data rate decoding device that may operate at each of a rising time and a falling time of the clock signal to facilitate effective control of channel selections.

Figure 5:
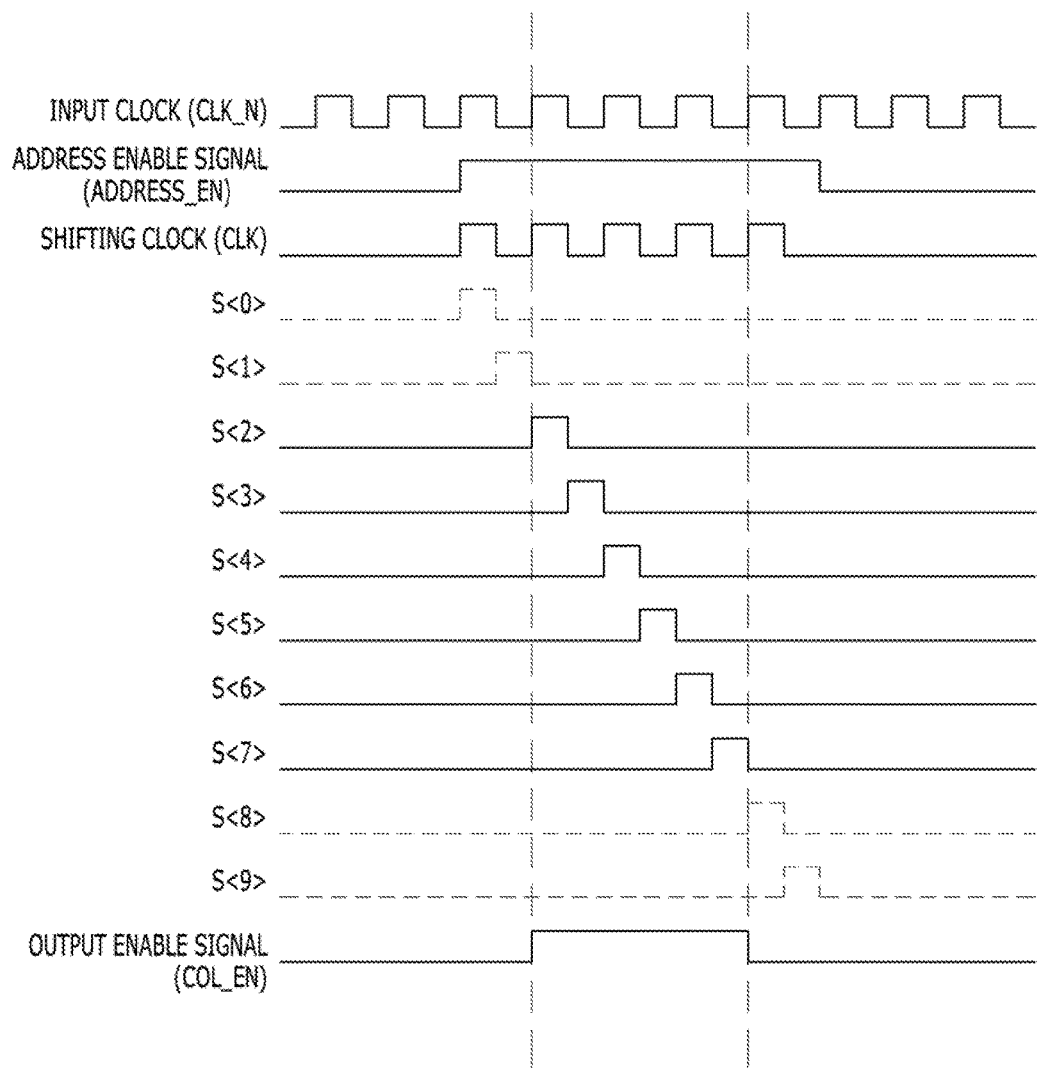
FIG. 5 is a timing chart illustrating an operation of a double data rate decoding device in accordance with an embodiment of the present invention.

FIG. 5 is a timing chart illustrating the operation of the double data rate decoding device in accordance with an embodiment of the present invention.

First, all the latches from the first through the n-th latches 421-428 may be initialized in response to the set pulse signal SET_PULSE.

Subsequently, a positive output Q<0> of the first latch 421 may be changed from a high level to a low level by a low level of a negative output Qb<1> of the second latch 422 and a high level of an inverted shifting clock CLK (or a low level of the shifting clock CLK) in synchronization with a falling edge of the shifting clock CLK due to an operation of a feedback input unit which will be described with reference to FIG. 6A.

In the meantime, a positive output Q<1> of the second latch 422 may be changed from a low level to a high level by the high level of the positive output Q<0> of the first latch 421 and a high level of the shifting clock CLK due to an operation of an input unit which will be described with reference to FIG. 6B. The positive output Q<1> of the second latch 422 may be changed from a high level to a low level by a low level of the negative output Qb<2> of the third latch 423 and the high level of the shifting clock CLK due to the operation of the feedback input unit which will be described with reference to FIG. 6B. Also, the second latch 422 may maintain the positive output Q<1> until the positive output Q<0> of the first latch 421 and the shifting clock CLK become the high level. The outputs of the third to eighth latches 423-428 may be changed similarly to the outputs Q<0> and Q<1>.

Figure 6A:
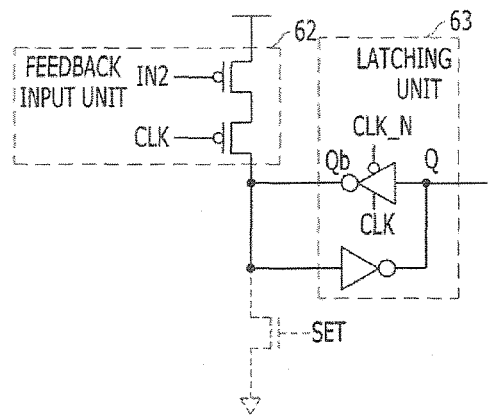
FIGS. 6A through 6D are circuit diagrams of latches in accordance with to embodiments of the present invention.
Figure 6B:
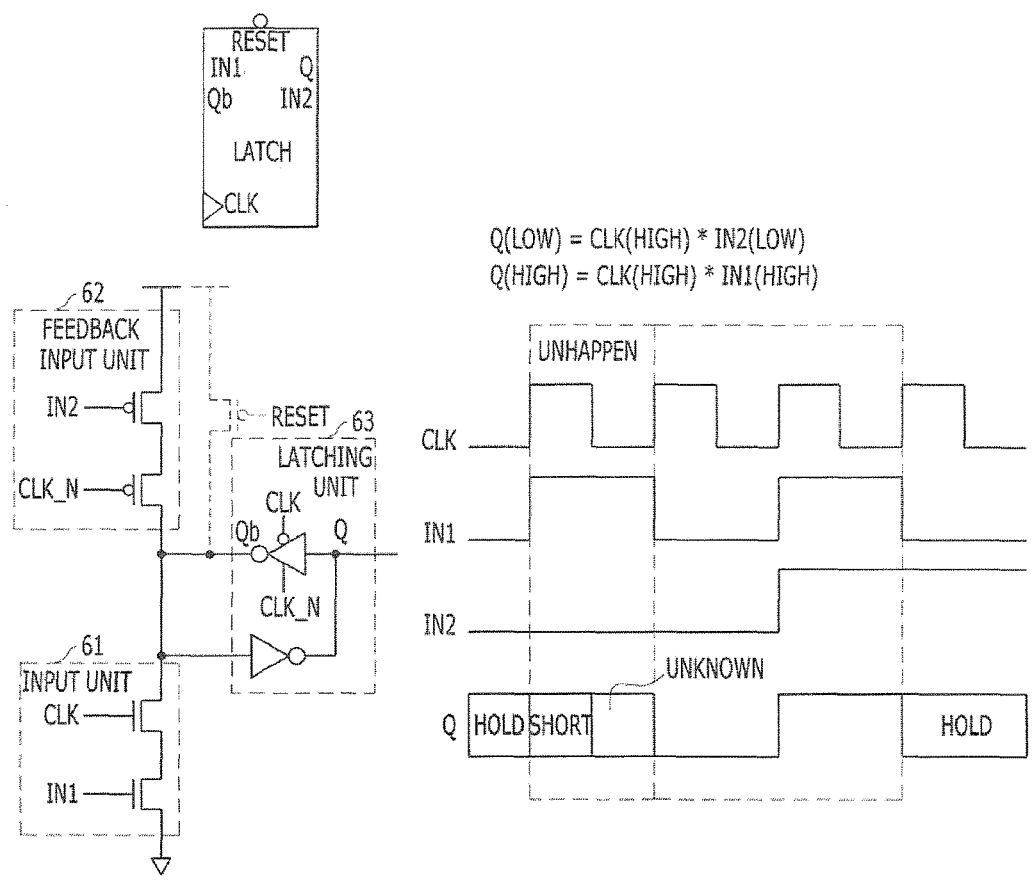
Figure 6C:
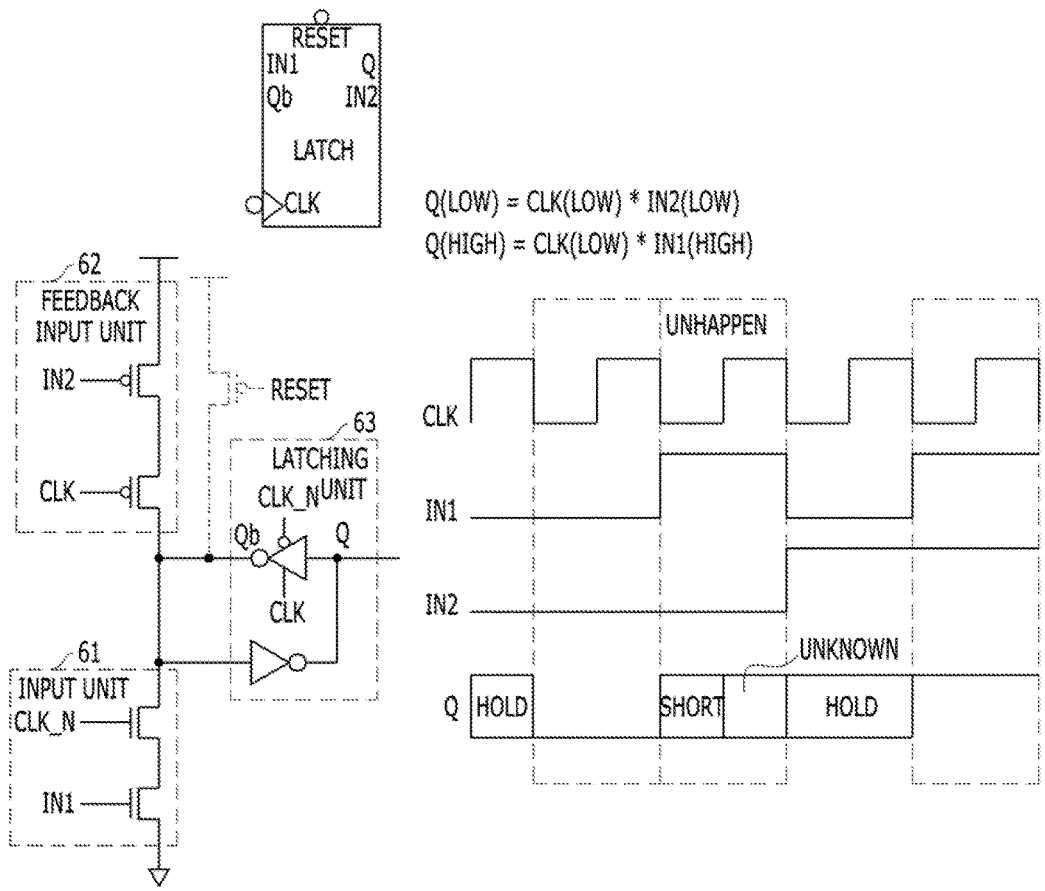
Figure 6D:
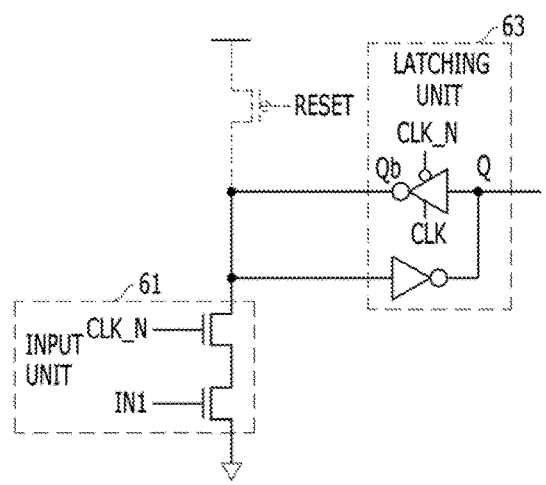

FIGS. 6A to 6D are circuit diagrams of the latches shown in FIG. 4 according to embodiments of the present invention. FIG. 6A illustrates a negative-edge-triggered latch with a set input, i.e., a start latch. FIG. 6B illustrates a positive-edge-triggered latch with a reset input, i.e., one kind of intermediate latch, along with a timing chart thereof. FIG. 6C illustrates a negative-edge-triggered latch with a reset input, i.e., another kind of intermediate latch, along with a timing chart thereof. FIG. 6D illustrates a positive-edge-triggered latch with a reset input, i.e., an end latch.

Here, the selection of the latch with the set input or the latch with the reset input for each stage may be determined depending on which voltage, i.e., a ground level or a supply voltage level, may be used for the initialization of the latch.

A positive output Q and a negative output Qb of the current latch stage may be changed when an output of the preceding latch stage may be inputted to the input unit 61. The negative output Qb of the current latch stage may be used as a feedback input for holding the output of the preceding latch stage and changing the output of the preceding latch stage from the high level to the low level during a phase of next shifting clock. Also, the positive output Q of the current latch stage may be used as an input to a next latch stage. The positive output Q of the current latch stage may be changed from the high level to the low level after receiving the negative output Qb of the next latch stage as the feedback input.

As shown in FIG. 6A, the first latch 421, i.e., the start latch in accordance with an embodiment of the present invention may include a feedback input unit 62 configured to use the shifting clock CLK and the negative output of the next latch stage as inputs, and a latching unit 63 configured to hold data according to the state of the shifting clock CLK. The first latch 421 may not be equipped with an input unit 61, unlike the latches shown in FIGS. 6B and 6C.

As shown in FIG. 63, the latches 422, 424 and 426 according to an embodiment of the present invention may include an input unit 61 configured to use the shifting clock CLK and the output of the preceding latch stage as inputs, a feedback input unit 62 configured to use an inverted shifting clock. CLK_N and the negative output of the next latch stage as inputs, and a latching unit 63 configured to hold data according to the state of the shifting clock CLK.

As shown in FIG. 6C, the latches 423, 425, and 427 according to an embodiment of the present invention may include an input unit 61 configured to use the inverted shifting clock CLK_N and the output of the preceding latch stage as inputs, a feedback input unit 62 configured to use the shifting clock CLK and the negative output of the next latch stage as inputs, and a latching unit 63 configured to hold data according to the state of the shifting clock CLK.

As shown in FIG. 6D, the n-th latch 428 according to an embodiment of the present invention may include an input unit 61 configured to use the shifting clock CLK and the output of the preceding latch stage as inputs, and a latching unit 63 configured to hold data according to the state of the shifting clock CLK. The n-th latch 428 may not be equipped with the feedback input unit 62, unlike the latches shown in FIGS. 6B and 6C.

In the latches 422, 424, 426, and 428 shown in FIGS. 6B to 6D, the input unit 61 may be configured so that the current latch stage may have the high output level when both the output of the preceding latch stage and the shifting clock CLK are at the high level. In the latches 423, 425, and 427 shown in FIG. 6C, the input unit 61 are configured so that the current latch stage may have the high output level when the output of the preceding latch stage and the inverted shifting clock CLK_N are at the high level.

The feedback input unit 62 may receive a clock signal and the negative output of the next latch stage. The clock signal may be the inverted shifting clock CLK_N in the latches 422, 424, 426, and 428 shown in FIG. 6B or 6D where the input unit 61 may receive the shifting clock CLK. The clock signal may be the shifting clock CLK in the latches 423, 425, and 427 shown in FIG. 6C where the input unit 61 may receive the inverted shifting clock CLK_N. The feedback input unit 62 allows the output of the current latch stage to fall to the low level when the output of the next latch stage is changed to the high level. Since the feedback input unit 62 is implemented using PMOS inputs, the feedback input unit 62 may be turned on when both the clock signal and the negative output of the next latch stage may be activated to the low level, contrary to the NMOS input stages.

The latches may be arranged so that the clock phase of a preceding latch stage to a currently selected latch stage may be opposite to that of the currently selected latch stage, and the clock phase of the currently selected latch stage may be opposite to that of the next latch stage. Such a latch arrangement may be accomplished by alternately arranging the positive-edge-triggered latches and the negative-edge-triggered latches. As a result, the state transition timing of a currently selected latch stage may be shifted by half a shifting clock period compared with the preceding latch stage, thereby enabling the double data rate operation.

Also, the clock phase of the latching unit 63 may be set to be opposite to that of the input unit 61 to prevent a floating state of the latching unit 63 in an interval that the output of the preceding latch stage inputted through a first input terminal IN1 in the input unit 61 may be at the low level and the output of the next latch stage inputted through a second input terminal IN2 in the feedback input unit 62 may be at the high level.

Referring to FIG. 6B, the positive-edge-triggered latch with reset input may have the high output level when both the output of the preceding latch stage inputted to a first input terminal IN1 in the input unit 61 and the shifting clock CLK are at the high level.

Also, the output Q of the latch may fall to the low level when the negative output of the next latch stage inputted to a second input terminal IN2 in the feedback input unit 62 is at the low level and the inverted shifting clock CLK_N falls to the low level (i.e., the shifting clock CLK rises to the high level).

If the output of the preceding latch stage inputted to the first input terminal IN1 is at the high level and the negative output of the latch stage inputted to the second input terminal IN2 the low level when the shifting clock CLK rises to the high level, a short path may be formed between a supply voltage level and a ground level of the latching unit 63, rendering the output Q of the latch unknown. However, the high and low level signals cannot be simultaneously inputted to the first and second input terminals IN1 and IN2, respectively, in a structure that the positive-edge-triggered latches and the negative-edge-triggered latches may be arranged alternately as described above.

Meanwhile, during an interval when the shifting clock CLK is at the low level in the positive-edge-triggered latch, the current latch stage may maintain a state holding the output of the preceding latch stage.

Referring to FIG. 6C the negative-edge-triggered latch with reset input may have the high output level when both the output of the preceding latch stage inputted to the first input terminal IN1 and the inverted shifting clock CLK_N are at the high level (i.e., the shifting clock CLK is at the low level).

Also, the output Q of the latch may fall to the low level when the negative output of the next latch stage inputted to the second input terminal IN2 in the feedback input unit 62 is at the low level and the shifting clock CLK falls to the low level.

If the output of the preceding latch stage inputted to the first input terminal IN1 is at the high level and the negative output of the latch stage inputted to the second input terminal IN2 is at the low level when the shifting clock CLK falls to the low level, a short path may be formed between the supply voltage level and the ground level of the latching unit 63, rendering the output Q of the latch unknown. However, it is impossible that the high and low level signals are simultaneously inputted to the first and second input terminals IN1 and IN2, respectively, in a structure that the positive-edge-triggered latches and the negative-edge-triggered latches may be arranged alternately as described above.

Meanwhile, during an interval when the shifting clock CLK is at the high level in the negative-edge-triggered latch, the current latch stage may maintain the state holding the output of the preceding latch stage.

Figure 7:
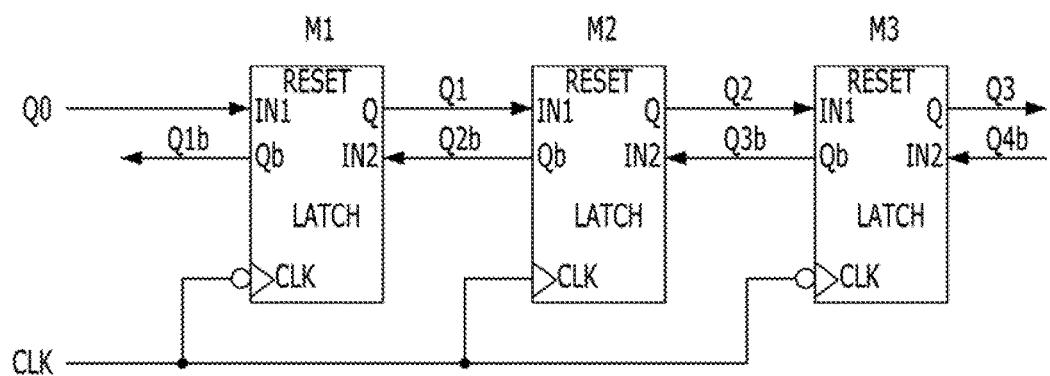
FIG. 7 illustrates in detail an operation of a second through (n−1)-th latches in accordance with an embodiment of the present invention.
Figure 7:
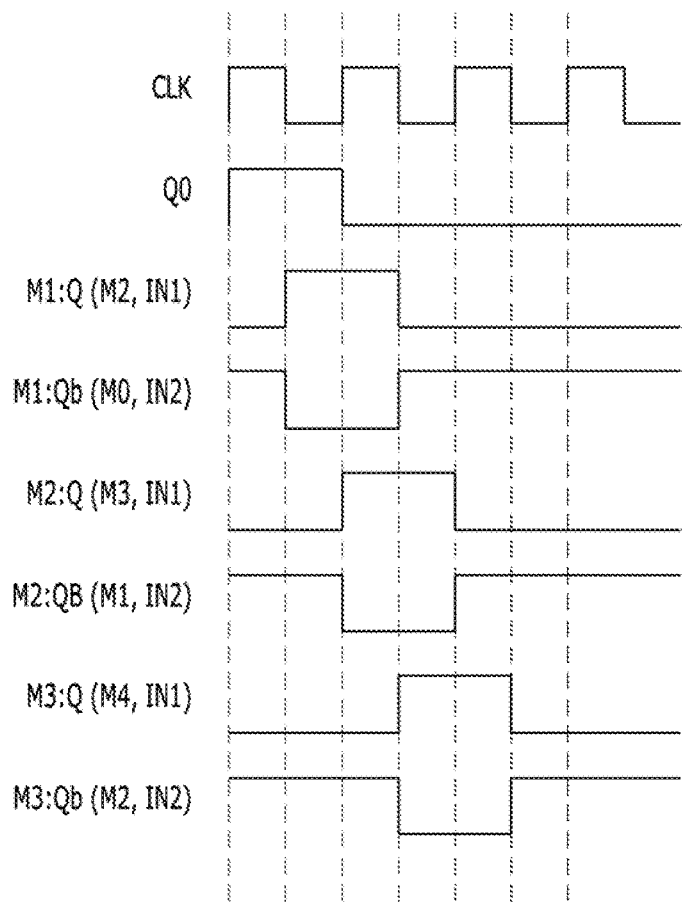

FIG. 7 illustrates in detail an operation of the second to (n−1)-th latches 422-427 according to an embodiment of the present invention. In particular, FIG. 7 illustrates an operation of the first input terminal IN1 and the second input terminal IN2 in the latches due to alternate disposition of the negative-edge-triggered latches and the positive-edge-triggered latches.

In the drawing, the latches M1 and M3 denote the negative-edge-triggered latches for inverting their states at the falling edge of the shifting clock CLK, and the latch M2 denotes the negative-edge-triggered latch for inventing its state at the rising edge of the shifting clock CLK.

Accordingly, latch M2 may receive the positive output Q of latch M1 when the shifting clock CLK is changed to the high level. At this time the latch M1 having received already the output of its preceding latch stage in response to the high level of the shifting clock CLK may be outputting the high signal level. When the shifting clock CLK is at the high level, the latch M2 may output the high signal level as the positive output Q while outputting the low signal level as the negative output Qb to the second input terminal IN2 of the latch M1.

When the shifting clock CLK is inverted to the low level, latch M2 may hold the positive output Q and the negative output Qb in the latching unit 63. In the latch M1, the feedback input unit 62 may receive the negative output. Qb of latch M2 through the second input terminal IN2 and may invert the positive output Q of the latch M1 to the low level. At this time, the first input terminal IN1 of latch M2 was changed to the low level due to the negative output Qb of the latch M1.

Similarly, the latch M3 may receive the positive output of the latch M2 through its first input terminal IN1 when the shifting clock CLK is at the low level, and may output the high level of the positive output Q and the low level of the negative output Qb. Afterwards, when the shifting clock CLK is inverted to the high level, the negative output Qb of the latch M3 may be fed back to the second input terminal of the latch M2 to invert the positive output Q of the latch M2 to the low level.

Although, it is described above that the decoding device, may operate in the double data rate, the decoding device may also operate in a single data rate. For example, the input clock may be divided by two and fed to the decoding device.

Although various embodiments have been described for illustrative purposes, it will be apparent to those skilled in the relevant art that various changes and modifications may be made without departing from the spirit and/or scope of the invention as defined in the following claims.

What is claimed is:

1. A double data rate decoding device, comprising:
   a shifting unit comprising a plurality of positive-edge-triggered latch stages and a plurality of negative-edge-triggered latch stages disposed alternately to shift pulse signals every half a cycle of a shifting clock and suitable for operating in double data rate due to an alternate disposition of the plurality of positive-edge-triggered latch stages and the plurality of negative-edge-triggered latch stages; and
   a decoding unit suitable for decoding the pulse signals shifted and outputted by the shifting unit every half the cycle,
   wherein the shifting unit comprises:
   a first latch stage among said plurality of negative-edge-triggered latch stages having a set input terminal, the first latch stage being suitable for receiving the shifting clock from a clock controller through an inverted clock terminal thereof and a negative output of a second latch stage through a second input terminal thereof, the second latch stage being a positive-edge-triggered latch among said plurality of positive-edge-triggered latch stages;
   the second latch stage having a reset input terminal suitable for receiving the shifting clock through an inverted clock terminal thereof, receiving a positive output of the first latch through a first input terminal thereof, and receiving a negative output of the third latch stage through a second input terminal thereof, the third latch stage being a negative-edge-triggered latch stage among said plurality of negative-edge-triggered latch stages;
   an (n−1)-th latch stage which is a negative-edge-triggered latch stage among said plurality of negative-edge-triggered latch stages, the (n−1)-th latch stage having a reset input terminal and being suitable for receiving the shifting clock through a clock terminal or an inverted clock terminal thereof, receiving a positive output of an (n−2)-th latch stage through a first input terminal thereof, and receiving a negative output of an n-th latch stage through a second input terminal thereof, (the n−2)-latch stage being a positive-edge-triggered latch stage among said plurality of positive-edge-triggered latch stages; and
   the n-th latch stage being a positive-edge-triggered latch stage among said plurality of positive-edge-triggered latch stages, having a reset input terminal and being suitable for receiving the shifting clock through an inverted clock terminal thereof, and for receiving a positive output of the (n−1)-th latch through a first input terminal thereof,
   wherein n is an integer equal to or greater than 4.

2. The double data rate decoding device of claim 1, further comprising:
   a selection unit suitable for selectively outputting a decoded signal from the decoding unit.

3. The double data rate decoding device of claim 2, wherein the selection unit selectively outputs the decoded signal in a preset interval of a data pulse signal.

4. The double data rate decoding device of claim 2, wherein the selection unit comprises:
   a plurality of AND gates suitable for performing AND operations on the decoded signal from the decoding unit and an output enable signal from an external controller.

5. The double data rate decoding device of claim 1, wherein
   the first latch stage further comprises:
   a feedback input unit suitable for using the shifting clock and the negative output of the second latch stage as inputs; and
   a latching unit suitable for holding data according to a state of the shifting clock.

6. The double data rate decoding device of claim 1, wherein
   an m-th latch stage among said plurality of negative-edge-triggered latch stages and said plurality of positive-edge-triggered latch stages comprises:
   an input unit suitable for using the shifting clock and the positive output of the preceding (m−1)-th latch stage as inputs;
   a feedback input unit suitable for using the shifting clock and the negative output of the next (m+1)-th latch stage as inputs; and
   a latching unit suitable for holding data according to a state of the shifting clock,
   wherein m is an integer from 2 to n−1.

7. The double data rate decoding device of claim 6, wherein, when the output of the (m+1)-th latch stage is changed to a high level, the feedback input unit of the m-th latch stage receives the negative output of the (m+1)-th latch stage and changes the positive output of the m-th latch stage to a low level according to the shifting clock.

8. The double data rate decoding device of claim 1, wherein the decoding unit comprises:
   a plurality of AND gates each suitable for performing an AND operation on positive outputs of two adjacent latch stages in the shifting unit.

* * * * *